United States Patent
Chang et al.

(10) Patent No.: US 6,884,299 B2
(45) Date of Patent: Apr. 26, 2005

(54) DEPOSITION APPARATUS FOR ORGANIC LIGHT-EMITTING DEVICES

(75) Inventors: Yi Chang, Hsin Chu (TW); Jih-Yi Wang, Hsin Chu (TW); Mao-Kuo Wei, Hsin Chu (TW); Tien-Rong Lu, Hsin Chu (TW)

(73) Assignee: RiTdisplay Corporation, Hsinchu (TW)

( * ) Notice: Subject to any disclaimer, the term of this patent is extended or adjusted under 35 U.S.C. 154(b) by 132 days.

(21) Appl. No.: 10/322,727

(22) Filed: Dec. 19, 2002

(65) Prior Publication Data

US 2003/0116088 A1 Jun. 26, 2003

(30) Foreign Application Priority Data

Dec. 26, 2001 (TW) ........................................ 90132425 A

(51) Int. Cl.[7] ............................ C23C 16/00; C23C 14/00
(52) U.S. Cl. ........................ 118/719; 118/720; 118/726; 118/730; 204/298.25
(58) Field of Search .................................. 118/719, 726, 118/720, 730; 156/345.31, 345.32; 204/298.25, 298.23, 298.26–298.28; 414/939

(56) References Cited

U.S. PATENT DOCUMENTS

| | | | | |
|---|---|---|---|---|
| 4,426,569 A | * | 1/1984 | Miller et al. | ................ 392/388 |
| 5,091,217 A | * | 2/1992 | Hey et al. | ................ 427/248.1 |
| 5,459,546 A | * | 10/1995 | Penn | ............................ 355/53 |
| 5,667,592 A | * | 9/1997 | Boitnott et al. | ............. 118/719 |
| 5,704,980 A | * | 1/1998 | Misiano et al. | ............. 118/708 |
| 5,863,170 A | * | 1/1999 | Boitnott et al. | ........ 414/222.13 |
| 6,143,082 A | * | 11/2000 | McInerney et al. | ......... 118/719 |
| 6,179,923 B1 | * | 1/2001 | Yamamoto et al. | ......... 118/719 |
| 6,203,619 B1 | * | 3/2001 | McMillan | ................... 118/719 |

* cited by examiner

Primary Examiner—Gregory Mills
Assistant Examiner—Karla Moore
(74) Attorney, Agent, or Firm—Birch, Stewart, Kolasch & Birch, LLP

(57) ABSTRACT

A deposition apparatus for organic light emitting devices. The deposition apparatus includes a substrate conveying system and at least a chamber. In this case, the substrate conveying system is a circular turntable shape. The chambers are provided around the substrate conveying system in a specific order. While the substrate conveying system rotates in a circular direction, at least a substrate is transferred into the chambers for deposition. The substrate carrier, a shadow mask and a shadow mask alignment system, are positioned on the substrate carrier. After the deposition, at least a layer is deposited on each of the substrates, so as to manufacture at least an organic light-emitting device.

20 Claims, 5 Drawing Sheets

DEPOSITION APPARATUS FOR ORGANIC LIGHT-EMITTING DEVICES

BACKGROUND OF THE INVENTION

1. Field of Invention

The invention relates to a deposition apparatus for organic light-emitting devices and, in particular, to a deposition apparatus having a substrate conveying system between chambers.

2. Related Art

An organic light-emitting device which is excited by electric current, has advantages of planar, high contrast, fast displaying speed, simplify structure, lighter, high outdoor visibility, low electrical consuming, and high luminance. Therefore, the organic light-emitting device is one of the most potential displays recently. However, organic light-emitting devices are not suitable for large-scale manufacturing. It is a big issue to develop an organic light-emitting device with long-term use.

Generally, manufacturing processes of an organic light-emitting device include three stages:

(1) After a cleaning step, a substrate is transferred into an anode deposition machine for depositing an anode layer, and a photolithography process is implemented to form a required anode circuit pattern;

(2) The substrate is transferred into a chamber with organic emitting material and a chamber with cathode material for depositing processes; and (3) A moving box filled with vacuum or nitrogen is used to transfer the substrate into a passivation layer deposition chamber or a package machine, or a glove box is used to transfer the substrate into the passivation layer deposition chamber or package machine from the chamber with organic emitting material.

A substrate carrier under ambient pressure condition out of vacuum is used to transfer substrates between each deposition chamber. During the transferring, substrates are loaded/unloaded from the substrate carrier all the time, and are polluted by water, oxygen, and particles in the air. In particular, organic emitting materials of organic light-emitting devices are very sensitive to water and oxygen. In the present research, water and oxygen are the major cause of damage of the organic light-emitting devices. They are also the major limitation why the current organic light-emitting devices cannot be commercialized. Therefore, it is the key point to avoid damage induced by water and oxygen during each process, so as to commercialize the manufacturing processes of organic light-emitting devices.

In addition, deposition process is implemented under a vacuum condition, so that the frequency of releasing vacuum, transferring substrates under ambient pressure, and exhausting gas is increased, so that the manufacturing time is increased. Furthermore, the conventional deposition apparatus or coating apparatus utilizes a robot arm (3-dimensional) to transfer the substrates, so time lost in transferring substrates is increased. Therefore, the throughput of deposition apparatuses is greatly reduced, and the deposition process becomes the chock point of the manufacturing and decreases the benefit of other process machines such as photolithography apparatuses and package apparatuses.

FIG. 1A and FIG. 1B are showing two conventional deposition apparatuses that are a cluster deposition apparatus and an in-line deposition apparatus, respectively. As shown in FIG. 1A, the cluster deposition apparatus is composite of a plurality of chambers 11, 12, 13, 14, 15, and 16, and a mechanical substrate transferring system 1. The mechanical substrate transferring system 1 further includes a robot arm 10. First, the robot arm 10 loads/unloads a substrate from the loading/unloading chamber 11. Then, the substrate is placed into each of the chambers 12, 13, 14, 15, and 16 in turn by the robot arm 10. In this case, because the loading/unloading chamber 11 has to store a lot of substrates (no more than 25 pieces of substrates in general) and has a big size, the cluster deposition apparatus may waste much time on exhausting gases. In addition, there are many idle chambers, so that the throughput of the cluster deposition apparatus cannot be raised efficiently. Moreover, in those idle chambers, some expensive organic materials are wasted.

Referring to FIG. 1B, another conventional deposition apparatus, an in-line deposition apparatus, is shown. In this case, robot arms 101 and conveying chambers 102 are used for transferring substrates. However, there are many substrates staying in the chambers 111, 121, 131, 141, 151, or 161. Because the chambers are too large, it wastes much time on exhausting gases.

As mentioned above, the present invention discloses a deposition apparatus for an organic light-emitting device, which includes a substrate conveying system and at least a chamber. The substrate conveying system is a circular turntable shape. The chambers are provided around the substrate conveying system in a specific order. While the substrate conveying system rotates in a circular direction, at least a substrate is transferred into the chambers for deposition. The substrate, a shadow mask and a shadow mask alignment system are positioned on a substrate carrier. After the deposition, at least a layer is deposited on each of the substrates. In this invention, a substrate conveying system with a circular turntable shape is used, so that time lost during substrate transferred is shortened, transferring stability is increased, time for deposition is reduced, possibility of substrate pollution is decreased, time lost during conveying in substrate carrier and loading/unloading is decreased, and the utility rate of organic materials is raised. Moreover, the cost of machines, cycle time of device manufacturing, and cost of device manufacturing are greatly decreased. As a result, the deposition apparatus of the invention can improve the throughput of organic light-emitting devices from 100~300 sheet/day to more than 5,000 sheet/day.

SUMMARY OF THE INVENTION

The present invention provides a deposition apparatus for an organic light-emitting device, which transfers substrates synchronously so as to greatly shorten the transferring time of substrates.

It is an objective of the invention to provide a deposition apparatus to shorten time lost during substrate transferring and loading/unloading, reduce possibility of substrate pollution, and increase transferring stability.

It is another objective of the invention to provide a deposition apparatus to reduce evaporation time and cycle time of device manufacturing, decrease cost of device manufacturing, and greatly reduce the cost of machines.

To achieve the above objectives, a deposition apparatus of this invention includes a substrate conveying system having a circular turntable shape, and at least a chamber provided around the substrate conveying system in a specific order. While the substrate conveying system rotates in a circular direction, at least a substrate is synchronously transferred into the chambers so as to shorten time lost during substrate transferring and loading/unloading, reduce possibility of substrate pollution, and increase transferring stability. The substrate, a shadow mask and a shadow mask alignment system are positioned on a substrate carrier. After that, a deposition process is implemented to form at least a layer on the substrates. In the current invention, the chambers include a loading/unloading chamber and a variety of deposition chambers. The deposition chambers of this invention are utilized for depositing an organic emitting layer, a cathode layer, an anode layer, and/or a passivation layer.

BRIEF DESCRIPTION OF THE DRAWINGS

The invention will become more fully understood from the detailed description given in the herein below illustration, and thus are not limitative of the present invention, and wherein.

DETAILED DESCRIPTION OF THE INVENTION

In general, an organic light-emitting device mainly includes a substrate, an anode layer, an organic emitting layer, a cathode layer, and a passivation layer. The organic emitting layer includes a hole injecting layer, a hole transporting layer, a luminescent layer, an electron transporting layer, and an electron injecting layer. This invention mainly provides a deposition apparatus of organic light-emitting devices, which utilizes a substrate conveying system with a circular turntable shape to transfer a substrate into each chamber for deposition in turn. Therefore, each of the mentioned layers is formed on a plurality of substrates. An embodiment of the present invention will hereinafter be explained in detail.

Figure 1A:
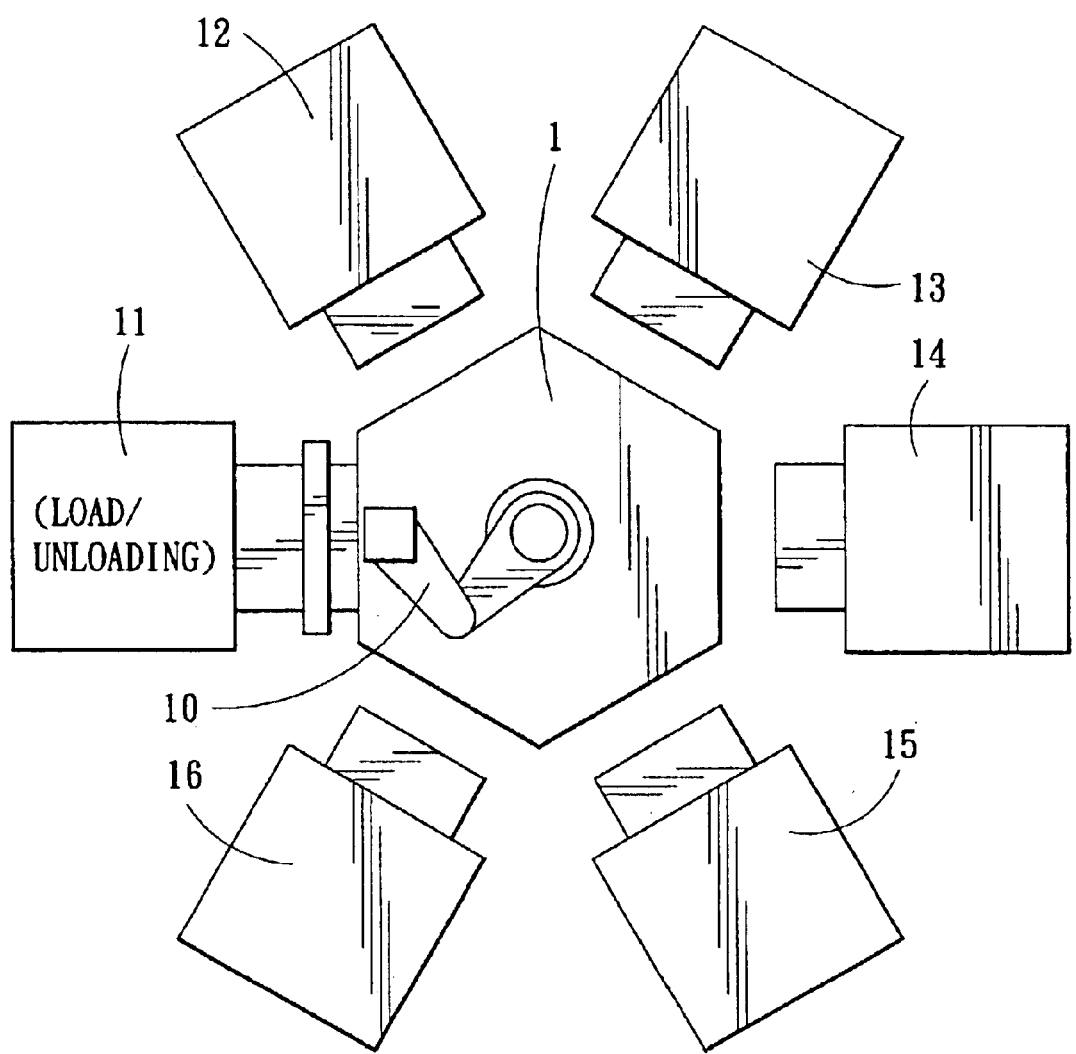
FIG. 1A is a schematic view of a conventional cluster deposition apparatus.
Figure 1B:
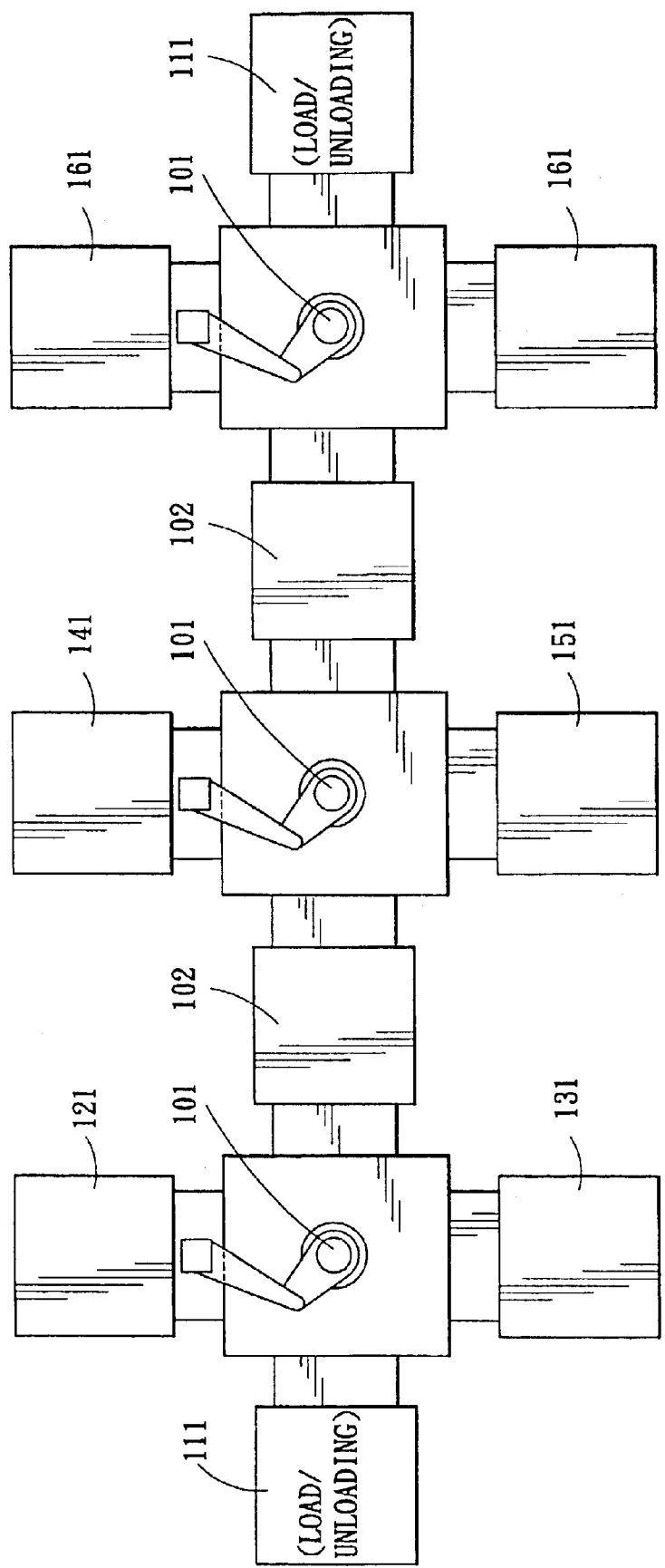
FIG. 1B is a schematic view of a conventional in-line deposition apparatus.
Figure 2:
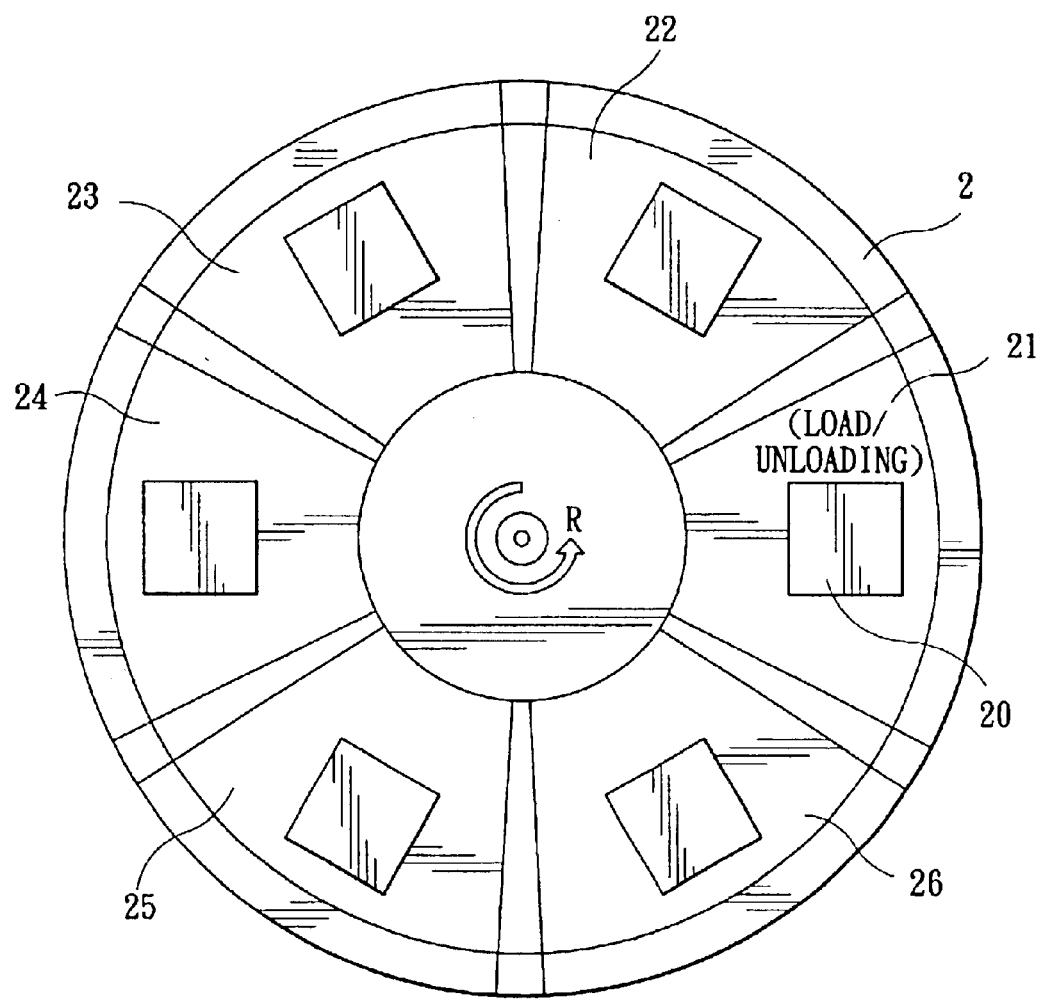
FIG. 2 is a schematic view of a deposition apparatus of the invention.
Figure 3:
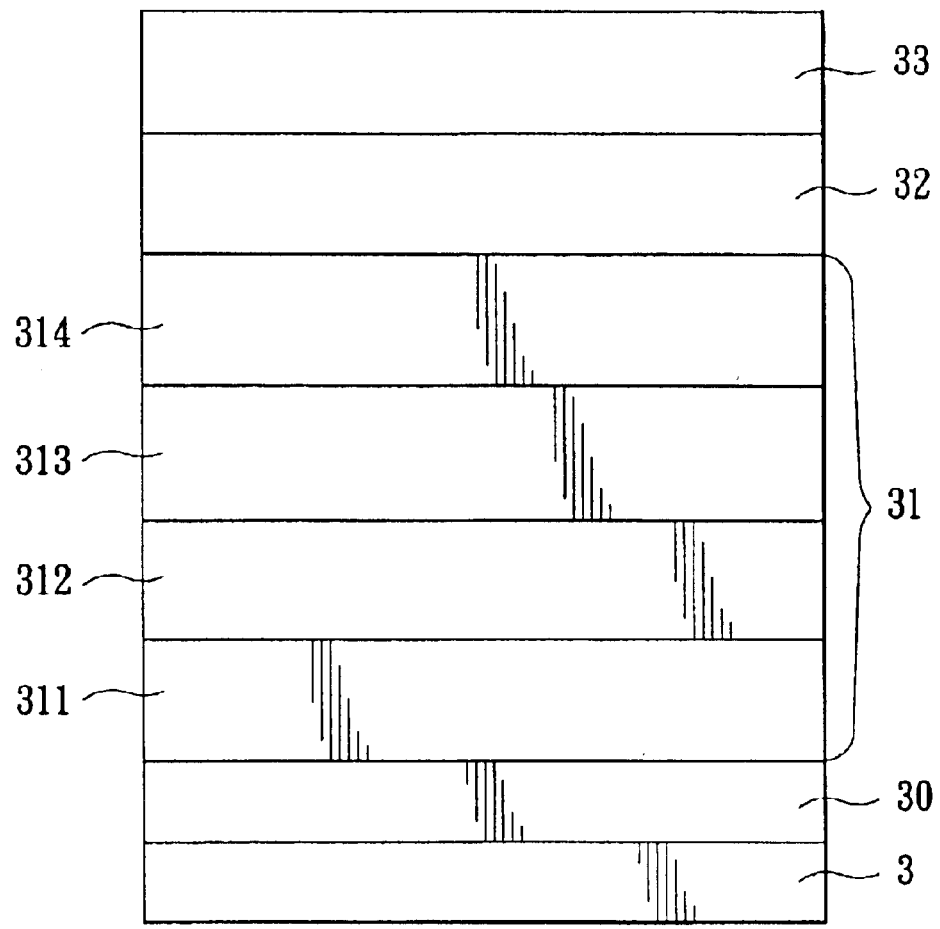
FIG. 3 is a schematic view of a substrate.

Referring to FIGS. 2 and 3, a deposition apparatus for organic light-emitting devices includes a substrate conveying system 2 and chambers 21, 22, 23, 24, 25, and 26. In the current embodiment, the substrate conveying system 2 is a circular turntable shape, and the chambers 21~26 are provided around the substrate conveying system 2 in a specific order. While the substrate conveying system 2 rotates in a circular direction R, a plurality of substrates 3 (as shown in FIG. 3) are synchronously transferred into the chambers 21~26 so as to manufacture at least an organic light-emitting device. The center of the substrate conveying system 2 is located at the center O of the deposition apparatus. In this embodiment, the chamber 21 is a loading/unloading chamber for loading/unloading the substrates 3 on at least a substrate carrier 20. Furthermore, the loading/unloading chamber 21 is operated under an ambient pressure condition, a vacuum condition, or an inert gas condition. Each of the chambers 22~26 is a deposition chamber for depositing at least a layer 30, 31, 32, or 33 on the substrate 3 (as shown in FIG. 3). In the substrate conveying system 2, the substrate carriers 20 and substrates 3 are rotated in a circular direction R, which is a counterclockwise direction as shown in FIG. 2. Alternatively, they can be rotated in a clockwise direction.

The rotating direction of the substrate carriers 20 and substrates 3 is determined depending on the arrangement of the chambers. Therefore, when the substrate conveying system 2 is rotated once, a plurality of substrates 3 are synchronously transferred into the chambers, respectively, so as to shorten time lost during substrate transferring and loading/unloading, reduce possibility of substrate pollution, and increase transferring stability.

As shown in FIG. 2, each of the chambers 21~26 is independent and isolated, and utilizes a vacuum system for exhausting to control the state of vacuum. Thus, a vacuum chamber is formed to avoid pollution. Furthermore, each of the deposition chambers 22~26 further include a deposition source system 40 (as shown in FIG. 4) for depositing at least a layer 31 and/or layer 32 on the substrates 3.

The deposition source system 40 of the invention has a single deposition source or a multiple deposition source. Further, the deposition source system 40 deposits materials from a lateral direction or a straight direction. In FIG. 4, a straight deposition is shown. Moreover, the deposition source system 40 of the invention further includes a crucible, a shutter, a deposition source material, a constant-temperature controller, and a deposition controller (not shown). The crucible is used to evaporate the variety deposition source materials. The shutter is used to open or enclose the crucible. The deposition source materials include variety of deposition materials such as an organic emitting layer material, a cathode layer material, a passivation layer material, and an anode layer material. The constant-temperature controller is used to control temperature of the deposition source material, and the deposition controller is used to control speed of depositing. In this case, the organic emitting layer material includes a hole injecting layer material, a hole transporting layer material, a luminescent layer material, an electron transporting layer material, and an electron injecting layer material. In the embodiment as shown in FIG. 2, each of deposition chambers 22~26 has a deposition source system, which respectively includes a hole injecting layer material, a hole transporting layer material, a luminescent layer material, an electron transporting layer material, and a cathode layer material. According to variety of manufacturing processes, the arrangement of deposition chambers of this invention can be increased or decreased. Although the amount of deposition chambers of the present embodiment is 5 (as shown in FIG. 2), person who skilled in the art can add or take off a deposition chamber or deposition chambers. For example, a deposition source including a passivation layer and/or anode layer material is added, so that an anode layer 30 and a passivation layer 33 (as shown in FIG. 3) can be formed after deposition processes. The loading/unloading chamber 21 loads/unloads the substrate 3 (as shown in FIG. 3) to the substrate carriers 20, then, the substrate conveying system 2 rotates the substrate carriers 20 and substrate 3 in a circular direction R, so as to synchronously transfer each of the substrate carriers 20 and substrates 3 into each of the chambers 22~26, respectively. With reference to FIG. 3, an organic emitting layer 31 and a cathode layer 32 of this present embodiment are formed accordingly. In this embodiment, the conveying system 2 rotating and transferring once requires 5 seconds. In FIG. 2, the substrate conveying system 2 further rotates the substrate carrier 20 and substrate 3 in the circular direction R in sequence, so as to transfer the substrate 3 into the deposition chamber 22 with a hole injecting layer deposition material, the deposition chamber 23 with a hole transporting layer deposition material, the deposition chamber 24 with a luminescent layer deposition material, the deposition chamber 25 with an electron transporting layer deposition material, and the deposition chamber 26 with an cathode layer deposition material in turn. The substrate 3 is deposited in each of the deposition chambers 22~26. In this embodiment, the actions including rotating, transferring and depositing are completed within 15 seconds. As a result, the deposition apparatus of this invention can reduce evaporation time and cycle time of device manufacturing, and decrease cost of device manufacturing. After each deposition process in each of the chambers, an organic light-emitting device as shown in FIG. 3 is formed, wherein an organic emitting layer 31, including a hole injecting layer 311, a hole transporting layer 312, a luminescent layer 313, and an electron transporting layer 314, and a cathode layer 32 is deposited on the substrate 3.

In addition, the deposition source system 40 of the current invention further includes a thickness detector and/or an adjusting system (not shown), so that the thickness of each layer can be controlled within a desired arrangement. The substrate carrier 20 of the invention further includes a substrate heating system (not shown) for heating the substrate 3 and controlling temperature of the substrate 3. In this case, the temperature of substrate 3 can be preheated to 150 Celsius degrees, so that the substrate 3 can be heated before being transferred into the deposition chamber 22, 23, 24, 25, or 26.

Figure 4:
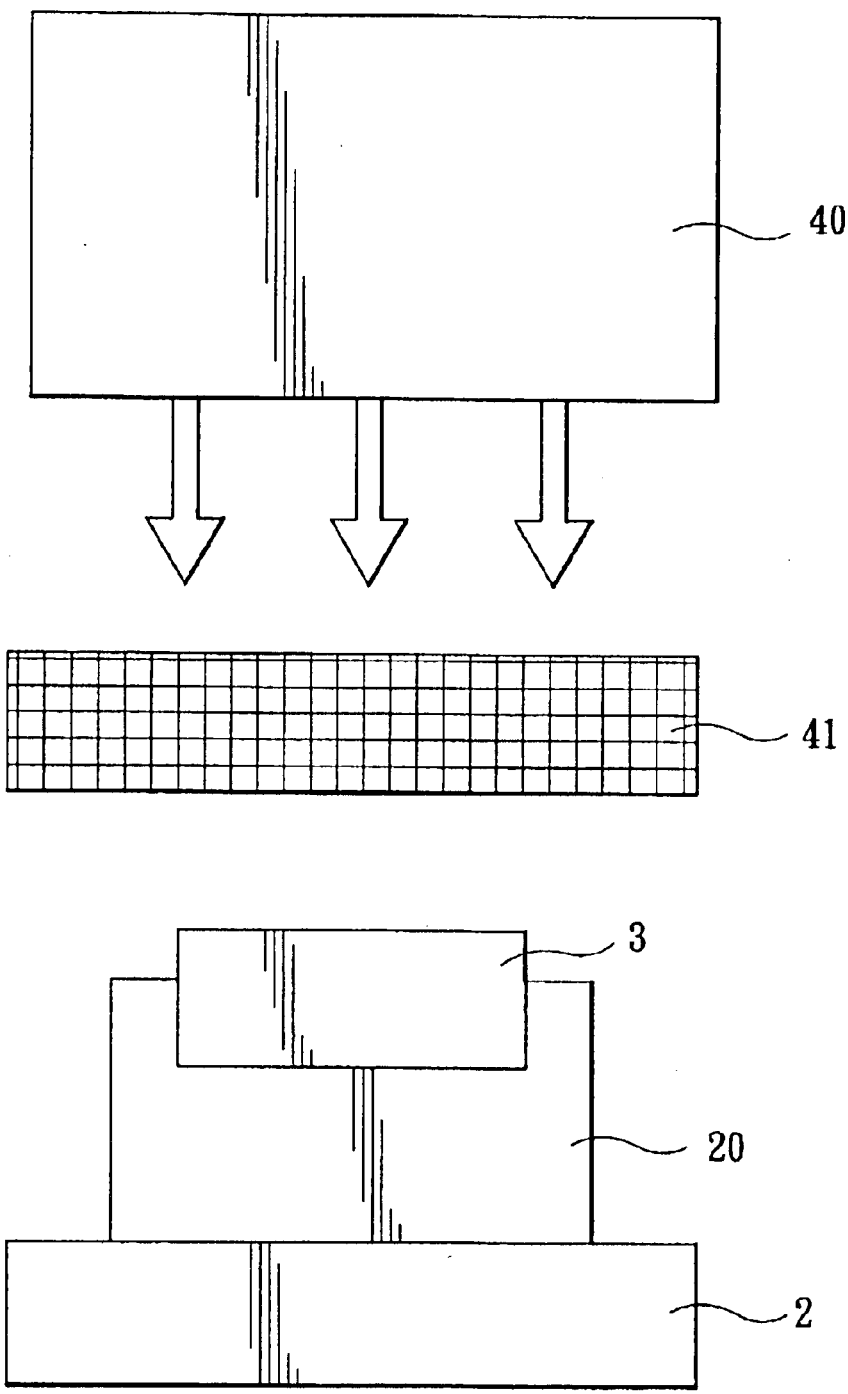
FIG. 4 is a schematic view illustrating the deposition process, which is implemented in a deposition chamber of the invention.

FIG. 4 shows a deposition operation in the deposition chamber 22, 23, 24, 25, or 26. First, the substrate 3 is posited on the substrate carrier 20, and then transferred into the deposition chamber 22, 23, 24, 25, or 26 by the substrate conveying system 2. A shadow mask 41 is provided between the substrate 3 and the deposition source system 40. Next, the deposition source system 40 is used for depositing at least a layer on the substrate (as shown in FIG. 3).

In this invention, the deposition apparatus further includes at least a shadow mask alignment system (not shown) and at least a shadow mask (as shown in FIG. 4). The shadow mask alignment system can be posited on the substrate carrier 20 directly, or inside the deposition chamber 22, 23, 24, 25, or 26. The shadow mask can be posited over the substrate, or inside the deposition chamber 22, 23, 24, 25, or 26. The shadow mask alignment system of the invention can be a mechanical alignment system or an optical alignment system. Wherein, the precision of the mechanical alignment system is within ±50 µm, and that of the optical alignment system is within ±3 µm. Furthermore, the organic light-emitting device manufactured by the deposition apparatus of this invention can be a monochromatic light-emitting device, a partial light-emitting device, or a full-color light-emitting device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A deposition apparatus for an organic light-emitting device, comprising:
    a substrate conveying system, which is a circular turntable shape;
    at least a chamber, set around the substrate conveying system in a specific order, wherein the substrate conveying system rotates in a circular direction and transfers a plurality of substrates into the chamber so as to from the organic light-emitting device;
    a substrate carrier, on which the substrates are placed;
    at least a shadow mask alignment system, positioned on the substrate carrier; and
    at least a shadow mask, positioned on the substrate carrier.

2. The deposition apparatus of claim 1, wherein the center of the substrate conveying system is located on the center of the deposition apparatus.

3. The deposition apparatus of claim 1, wherein the chamber comprises a deposition chamber for depositing at least a layer on the substrates.

4. The deposition apparatus of claim 1, wherein the chamber comprises at least a loading/unloading chamber for loading/unloading the substrates.

5. The deposition apparatus of claim 1, wherein the chamber is independent and isolated, and utilizes a vacuum system for exhausting gas to control the state of vacuum.

6. The deposition apparatus of claim 3, wherein the deposition chamber comprises a deposition source system used for depositing the layer on the substrates.

7. The deposition apparatus of claim 6, wherein the deposition source system is composite of a single deposition source or a multiple deposition source.

8. The deposition apparatus of claim 6, which the deposition source system deposits materials in the way selected from a lateral deposition or a straight deposition.

9. The deposition apparatus of claim 6, wherein the deposition source system further comprises a crucible, a shutter, a deposition source material, a constant-temperature controller for controlling temperature of the deposition source material, and a deposition controller for controlling speed of depositing.

10. The deposition apparatus of claim 6, wherein the deposition source system further comprises a thickness detector.

11. The deposition apparatus of claim 6, wherein the deposition source system further comprises an adjusting system.

12. The deposition apparatus of claim 11, wherein the deposition source material comprises an organic emitting material and a cathode material.

13. The deposition apparatus of claim 11, wherein the deposition source material comprises a passivation material.

14. The deposition apparatus of claim 11, wherein the deposition source material comprises an anode material.

15. The deposition apparatus of claim 12, wherein the organic emitting material is selected from a group of a hole injecting material, a hole transporting material, a luminescent material, an electron transporting material, and an electron injecting material.

16. The deposition apparatus of claim 1, wherein the shadow mask alignment system is composite of a mechanical alignment system or an optical alignment system.

17. The deposition apparatus of claim 1, wherein the substrate carrier is orientated in the way of horizontal or vertical.

18. The deposition apparatus of claim 1, wherein the substrate carrier further comprises a substrate heating system for heating and controlling temperature of the substrate.

19. The deposition apparatus of claim 4, wherein the loading/unloading chamber is operated under a condition selected form an ambient pressure condition, a vacuum condition, or an inert gas condition.

20. The deposition apparatus of claim 1, wherein the organic light-emitting device is selected from a monochromatic light-emitting device, a partial light-emitting device, or a full-color light-emitting device.

* * * * *